(12) United States Patent
Kojima

(10) Patent No.: US 7,572,730 B2
(45) Date of Patent: Aug. 11, 2009

(54) METHOD OF MANUFACTURING WIRING SUBSTRATE, LIQUID EJECTION HEAD AND IMAGE FORMING APPARATUS

(75) Inventor: Toshiya Kojima, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 405 days.

(21) Appl. No.: 11/645,649

(22) Filed: Dec. 27, 2006

(65) Prior Publication Data
US 2007/0148827 A1    Jun. 28, 2007

(30) Foreign Application Priority Data
Dec. 28, 2005    (JP)    ............................. 2005-378972

(51) Int. Cl.
*H01L 21/44*    (2006.01)
*H01L 23/52*    (2006.01)
*H01L 23/48*    (2006.01)
*H01L 21/768*   (2006.01)
*B41J 2/04*     (2006.01)

(52) U.S. Cl. ........................ 438/667; 438/668; 257/774; 257/773; 257/E21.597; 347/54

(58) Field of Classification Search ................. 438/667, 438/668; 257/773, 774, E21.597
See application file for complete search history.

(56) References Cited

U.S. PATENT DOCUMENTS

| | | | |
|---|---|---|---|
| 6,332,669 B1* | 12/2001 | Kato et al. | 347/54 |
| 2007/0063206 A1* | 3/2007 | Maeda | 257/88 |
| 2007/0146440 A1* | 6/2007 | Kojima et al. | 347/68 |

FOREIGN PATENT DOCUMENTS

| | | |
|---|---|---|
| JP | 7-231158 A | 8/1995 |
| JP | 8-230195 A | 9/1996 |

\* cited by examiner

*Primary Examiner*—Luan C Thai
(74) *Attorney, Agent, or Firm*—Birch, Stewart, Kolasch & Birch, LLP

(57) ABSTRACT

The method of manufacturing a wiring substrate includes the steps of: filling conductive material into a through hole and a non-through hole of a substrate; removing the conductive material filled into the through hole; and removing at least a portion of a rear side of the substrate which is opposite to a front side of the substrate at which the non-through hole is open, in such a manner that the non-through hole is open at the rear side of the substrate.

8 Claims, 13 Drawing Sheets

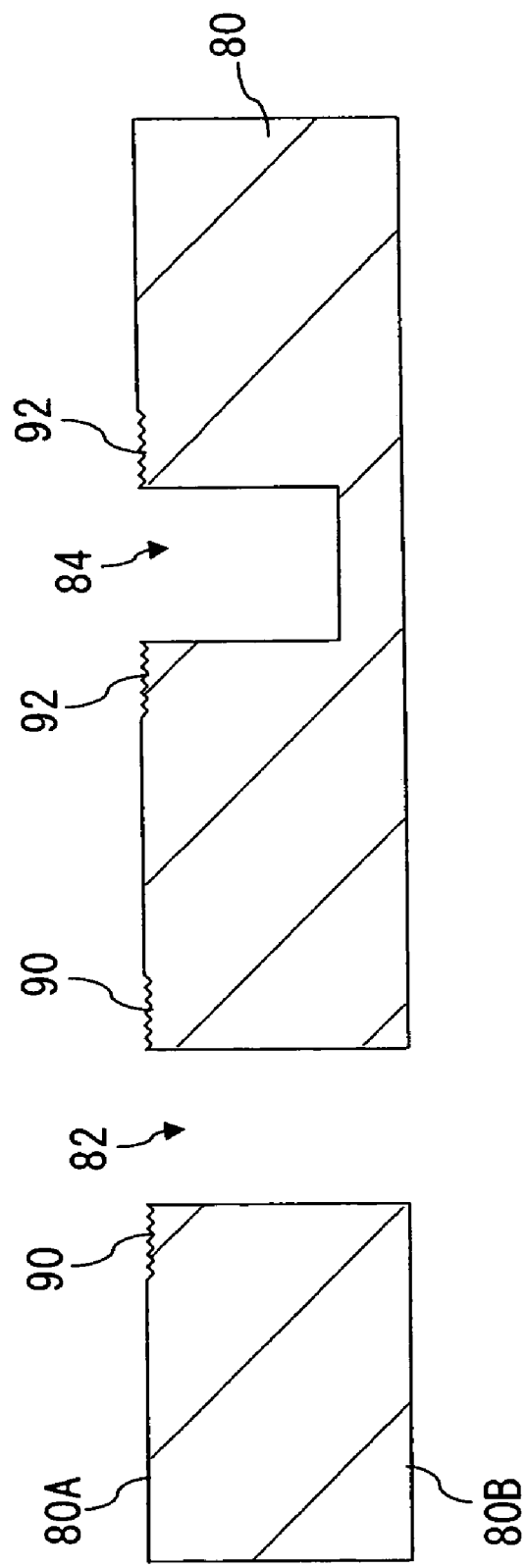

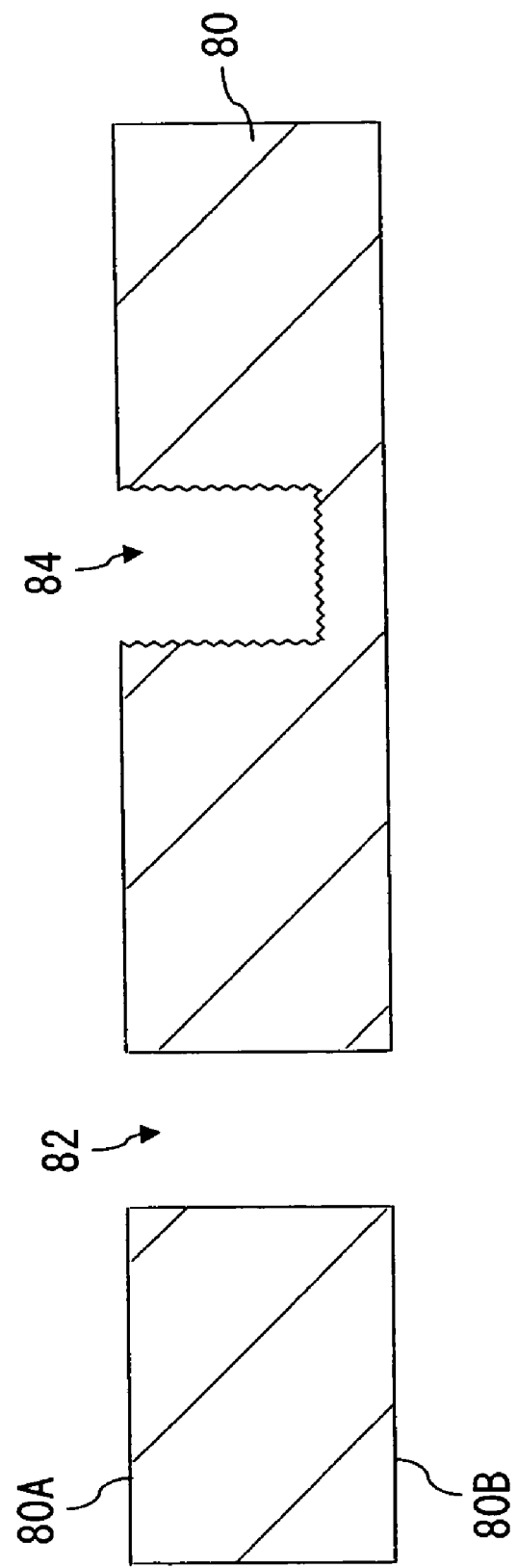

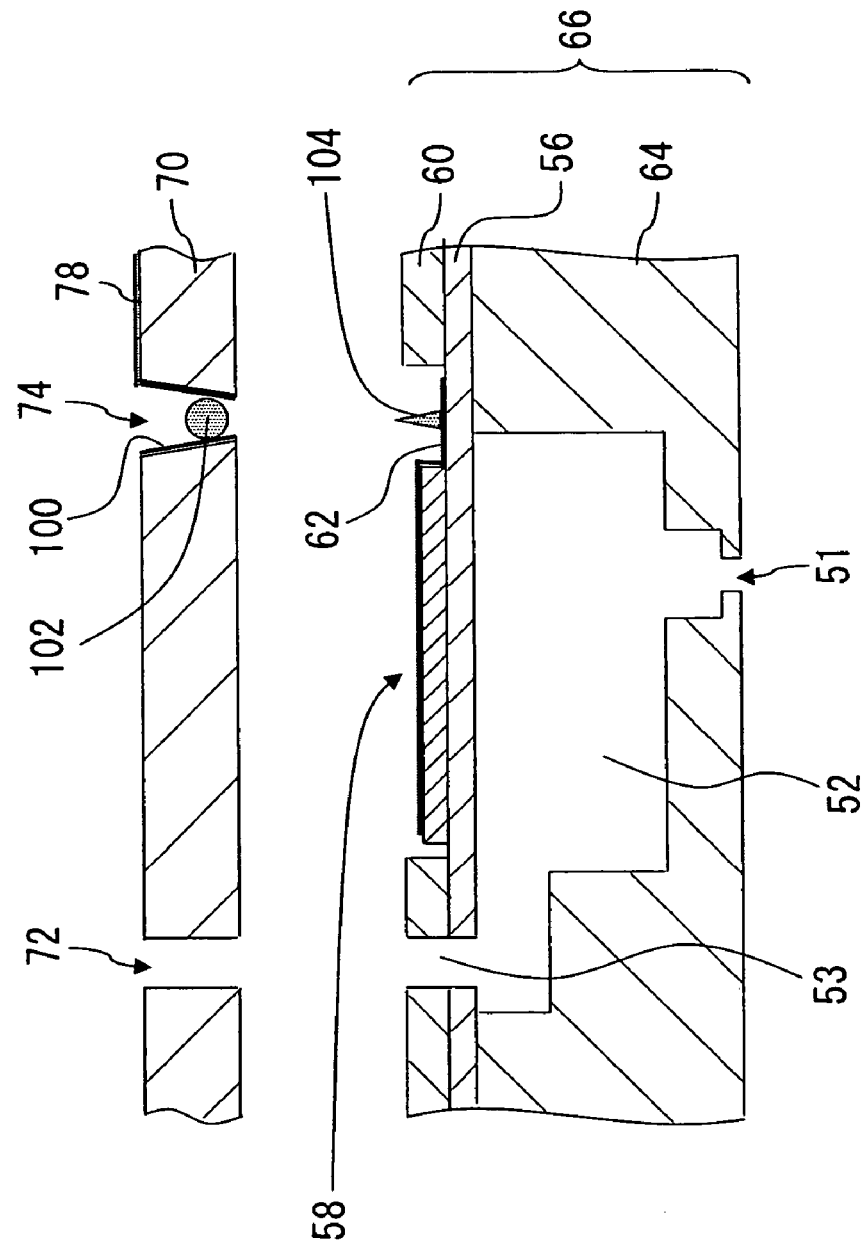

METHOD OF MANUFACTURING WIRING SUBSTRATE, LIQUID EJECTION HEAD AND IMAGE FORMING APPARATUS

BACKGROUND OF THE INVENTION

1. Field of the Invention

The present invention relates to a method of manufacturing a wiring substrate, a liquid ejection head and an image forming apparatus, and more particularly, to technology for manufacturing a wiring substrate having a conductive through hole and a non-conductive through hole.

2. Description of the Related Art

Inkjet recording apparatuses are known which comprise a head (liquid ejection head) having a plurality of nozzles, and which record images onto a recording medium by ejecting ink toward the recording medium from the head.

In a head of this type, ink droplets are ejected from nozzles by selectively driving ejection elements (for example, piezoelectric elements or heat generating elements) corresponding to the nozzles. For this purpose, the head is provided with a wiring substrate comprising wires for supplying drive signals to the ejection elements. In a wiring substrate of this kind, conductive through holes for creating electrical connections and non-conductive through holes for supplying ink are required.

As a method for forming such conductive layers selectively, for example, Japanese Patent Application Publication No. 7-231158 discloses a method in which a plating activation treatment film or protection film is transpired by a pattern radiation based on a laser light, thereby selectively forming plating layers. Japanese Patent Application Publication No. 8-230195 discloses a method of selectively forming plating layers by two shot injection molding of a plastic material which can be plated and a plastic material which cannot be plated.

Since, in order to improve the quality of the recorded image, the number of nozzles should be increased, then there arises a need to arrange an extremely large number of conductive and non-conductive through holes at high density in the wiring substrate. However, a method of manufacture has not yet been proposed which makes it possible to obtain a highly reliable wiring substrate having conductive and non-conductive through holes at low costs. For example, there is a method in which conductive paste is filled into or plating is carried out while parts to be non-conductive on a substrate having holes are masked; however, it is difficult to achieve good masking accuracy and positioning accuracy, and therefore it is difficult to obtain good reliability for a substrate.

Moreover, although the technologies disclosed in Japanese Patent Application Publications No. 7-231158 and No. 8-230195 have been proposed as methods for forming conductive parts and non-conductive parts on a wiring substrate, there are problems of the following kinds when these technologies are applied to conductive parts and non-conductive parts of through holes. According to the technology in Japanese Patent Application Publication No. 7-231158, although the pattern radiation by laser light is used, it is difficult to radiate laser light uniformly inside the through holes. Furthermore, the technology in Japanese Patent Application Publication No. 8-230195 can be used in the case of a low-density arrangement of holes, but, in the case where a large number of through holes are to be arranged at high density, it is difficult to make a die and to carry out molding. In both case, there is a problem in that it is difficult to form conductive layers selectively in a large number of through holes arranged at high density.

SUMMARY OF THE INVENTION

The present invention has been contrived in view of the foregoing circumstances, an object thereof being to provide a method of manufacturing a wiring substrate, whereby a wiring substrate having highly reliable conductive and non-conductive through holes arranged at high density can be manufactured inexpensively, and to a liquid ejection head and an image forming apparatus.

In order to attain the aforementioned object, the present invention is directed to a method of manufacturing a wiring substrate, including the steps of: filling conductive material into a through hole and a non-through hole of a substrate; removing the conductive material filled into the through hole; and removing at least a portion of a rear side of the substrate which is opposite to a front side of the substrate at which the non-through hole is open, in such a manner that the non-through hole is open at the rear side of the substrate.

According to this aspect of the present invention, after filling conductive material into the through hole and the non-through hole formed in the substrate, the conductive material inside the through hole is removed, and then the non-through hole are processed into a through hole. Thereby, the wiring substrate comprising the highly reliable conductive and non-conductive through holes arranged at high density can be manufactured inexpensively.

In order to attain the aforementioned object, the present invention is also directed to a method of manufacturing a wiring substrate, including the steps of: filling liquid containing at least a plating catalyst and solvent, into a through hole and a non-through hole of a substrate; carrying out plating by using the plating catalyst as a seed; and removing at least a portion of a rear side of the substrate which is opposite to a front side of the substrate at which the non-through hole is open, in such a manner that the non-through hole is open at the rear side of the substrate.

According to this aspect of the present invention, after filling liquid containing a plating catalyst and solvent into the through hole and the non-through hole formed in the substrate, a plating layer (conductive layer) is formed inside the non-through hole by a plating process, and the non-through hole is then processed into a through hole. Thereby, the wiring substrate comprising the highly reliable conductive and non-conductive through holes arranged at high density can be manufactured inexpensively.

Preferably, a surface roughness of an internal wall surface of the non-through hole is greater than a surface roughness of an internal wall surface of the through hole.

According to this aspect of the present invention, the adhesion characteristics of an electrode material of the plating catalyst with respect to the internal wall surface of the non-through hole is improved, while the removability of an electrode material or liquid filled into the through hole is also improved.

In order to attain the aforementioned object, the present invention is also directed to a liquid ejection head comprising a wiring substrate manufactured by any one of the above-mentioned methods of manufacturing a wiring substrate.

In order to attain the aforementioned object, the present invention is also directed to an image forming apparatus comprising any one of the above-mentioned liquid ejection heads.

According to the present invention, after filling a conductive material into a through hole and a non-through hole formed in a substrate, the conductive material inside the through hole is removed, and then the non-through hole is processed into a through hole. Therefore, a wiring substrate comprising highly reliable conductive and non-conductive through holes arranged at high density can be manufactured inexpensively.

BRIEF DESCRIPTION OF THE DRAWINGS

The nature of this invention, as well as other objects and benefits thereof, will be explained in the following with reference to the accompanying drawings, in which like reference characters designate the same or similar parts throughout the figures and wherein:

FIG. 5 is a diagram for illustrating an embodiment of the surface roughness of the upper surface of the substrate;

FIG. 6 is a diagram for illustrating an embodiment of the surface roughness of the inner surface walls of hole parts in the substrate;

FIG. 12 is an illustrative diagram showing an embodiment of a pin-shaped member provided on an electrical connection part.

DETAILED DESCRIPTION OF THE PREFERRED EMBODIMENTS

First Embodiment

Figure 1:
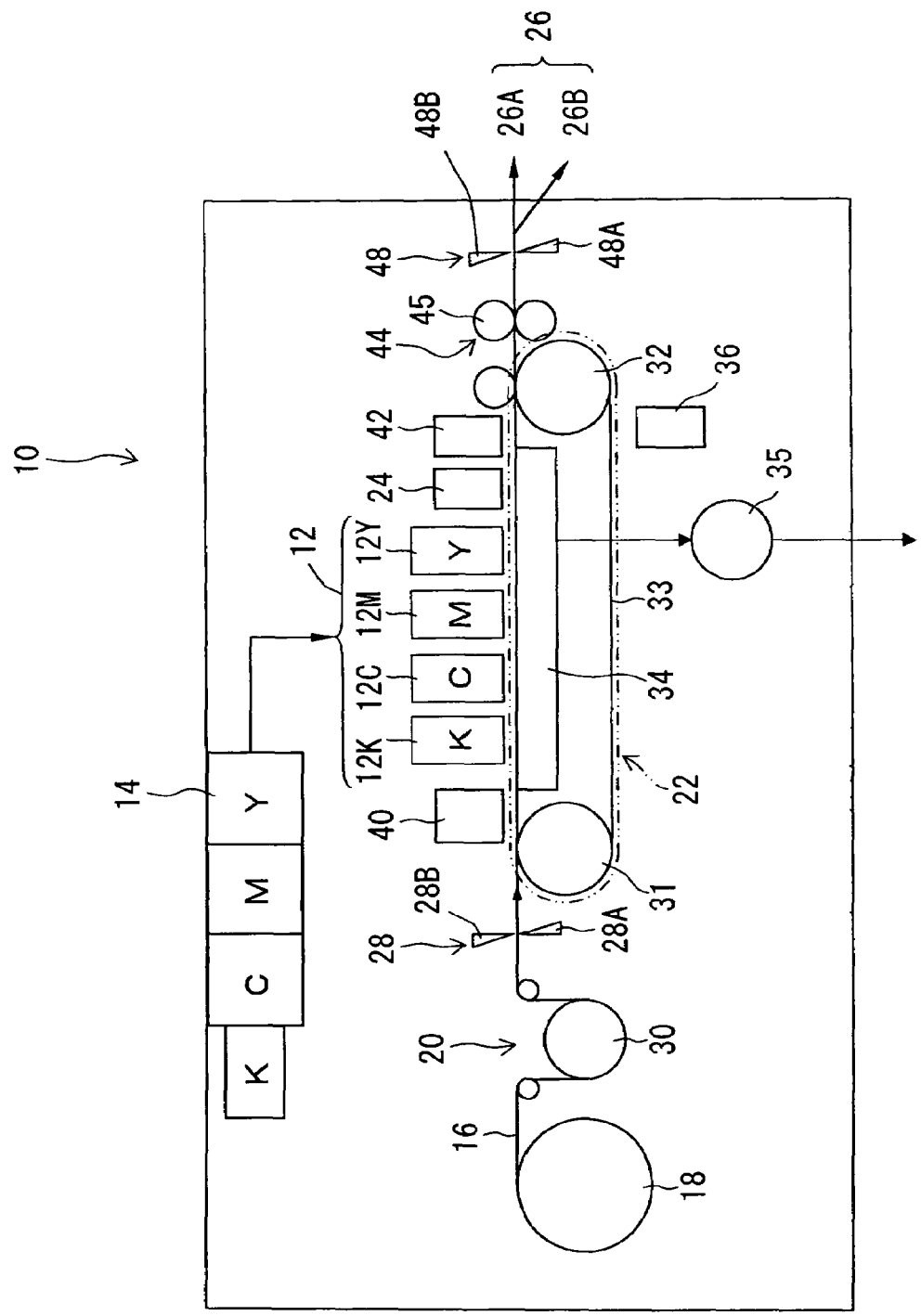
FIG. 1 is a general schematic drawing showing a general view of an inkjet recording apparatus.

FIG. 1 is a general schematic drawing showing a general view of an inkjet recording apparatus which corresponds to an image forming apparatus of an embodiment according to the present invention. As shown in FIG. 1, the inkjet recording apparatus 10 comprises: a printing unit 12 having a plurality of heads 12K, 12C, 12M, and 12Y for ink colors of black (K), cyan (C), magenta (M), and yellow (Y), respectively; an ink storing and loading unit 14 for storing inks of K, C, M and Y to be supplied to the print heads 12K, 12C, 12M, and 12Y; a paper supply unit 18 for supplying recording paper 16; a decurling unit 20 for removing curl in the recording paper 16 supplied from the paper supply unit 18; a suction belt conveyance unit 22 disposed facing the nozzle face (ink-droplet ejection face) of the print unit 12, for conveying the recording paper 16 while keeping the recording paper 16 flat; a print determination unit 24 for reading the printed result produced by the printing unit 12; and a paper output unit 26 for outputting image-printed recording paper (printed matter) to the exterior.

In FIG. 1, a magazine for rolled paper (continuous paper) is shown as an embodiment of the paper supply unit 18; however, more magazines with paper differences such as paper width and quality may be jointly provided. Moreover, papers may be supplied with cassettes that contain cut papers loaded in layers and that are used jointly or in lieu of a magazine for rolled paper.

In the case of a configuration in which roll paper is used, a cutter 28 is provided as shown in FIG. 1, and the roll paper is cut to a desired size by the cutter 28. The cutter 28 has a stationary blade 28A whose length is not less than the width of the conveyor pathway of the recording paper 16, and a round blade 28B which moves along the stationary blade 28A. The stationary blade 28A is disposed on the reverse side of the printed surface of the recording paper 16, and the round blade 28B is disposed on the printed surface side across the conveyance path. When cut paper is used, the cutter 28 is not required.

In the case of a configuration in which a plurality of types of recording paper can be used, it is preferable that an information recording medium, such as a bar code and a wireless tag, containing information about the type of paper be attached to the magazine, and by reading the information contained in the information recording medium with a predetermined reading device, the type of paper to be used is automatically determined, and ink-droplet ejection is controlled so that the ink droplets are ejected in an appropriate manner in accordance with the type of paper.

The recording paper 16 delivered from the paper supply unit 18 retains curl because of having been loaded in the magazine. In order to remove the curl, heat is applied to the recording paper 16 in the decurling unit 20 by a heating drum 30 in a direction opposite from the curl direction in the magazine. The heating temperature at this time is preferably controlled so that the recording paper 16 has a curl in which the surface on which the print is to be made is slightly round outward.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle faces of the printing unit 12 and the sensor face of the print determination unit 24 forms a plane.

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1. The suction chamber 34 provides suction with a fan 35 to generate a negative pressure, and the recording paper 16 on the belt 33 is held by the suction.

The belt 33 is driven in the clockwise direction in FIG. 1 by the motive force of a motor (not shown in FIG. 1) being transmitted to at least one of the rollers 31 and 32, which the belt 33 is set around, and the recording paper 16 held on the belt 33 is conveyed from the left to the right in FIG. 1.

Since ink adheres to the belt 33 when a marginless print job, or the like, is performed, a belt-cleaning unit 36 is disposed in a predetermined position (a suitable position outside the printing area) on the exterior side of the belt 33. Although the details of the configuration of the belt-cleaning unit 36 are not shown, embodiments thereof include: a configuration of nipping with a brush roller, a water absorbent roller, or the like; an air blow configuration in which clean air is blown; and a combination of these. In the case of the configuration of nipping with the cleaning rollers, it is preferable to make the line velocity of the cleaning rollers different from the line velocity of the belt in order to improve the cleaning effects.

The inkjet recording apparatus 10 can comprise a roller nip conveyance mechanism, instead of the suction belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed on the upstream side of the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

The print unit 12 is a so-called "full line head" in which a line head having a length corresponding to the maximum paper width is arranged in a direction (main scanning direction) that is perpendicular to the paper conveyance direction (sub-scanning direction). The heads 12K, 12C, 12M and 12Y forming the print unit 12 are constituted by line heads in which a plurality of ink ejection ports (nozzles) are arranged through a length exceeding at least one edge of the maximum size recording paper 16 intended for use with the inkjet recording apparatus 10.

The heads 12K, 12C, 12M and 12Y corresponding to respective ink colors are disposed in the order, black (K), cyan (C), magenta (M) and yellow (Y), from the upstream side (left-hand side in FIG. 1), following the direction of conveyance of the recording paper 16 (the paper conveyance direction). A color print can be formed on the recording paper 16 by ejecting the inks from the heads 12K, 12C, 12M, and 12Y, respectively, onto the recording paper 16 while the recording paper 16 is conveyed.

The print unit 12, in which the full-line heads covering the entire width of the paper are thus provided for the respective ink colors, can record an image over the entire surface of the recording paper 16 by performing an action of moving the recording paper 16 and the print unit 12 relatively to each other in the paper conveyance direction (sub-scanning direction) just once (in other words, by means of a single sub-scan). Higher-speed printing can be thereby made possible and productivity can be improved in comparison with a shuttle type head configuration in which a head moves reciprocally in a direction (main scanning direction) which is perpendicular to the paper conveyance direction (sub-scanning direction).

Furthermore, although the configuration with the K, C, M and Y. four standard colors is described in the present embodiment, combinations of the ink colors and the number of colors are not limited to those. Light inks or dark inks can be added as required. For example, a configuration is possible in which heads for ejecting light-colored inks, such as light cyan and light magenta, are added.

As shown in FIG. 1, the ink storing and loading unit 14 has tanks for storing inks of the colors corresponding to the respective heads 12K, 12C, 12M and 12Y, and the tanks are connected to the respective heads 12K, 12C, 12M, 12Y, via tube channels (not illustrated). Moreover, the ink storing and loading unit 14 also comprises: a notifying device (e.g., display device, alarm generating device, or the like) for generating a notification if the remaining amount of ink has become low; and a mechanism for preventing incorrect loading of ink of the wrong color.

The print determination unit 24 has an image sensor (line sensor) for capturing an image of an ink-droplet deposition result of the printing unit 12, and functions as a device to check for ejection defects, such as clogs of the nozzles in the printing unit 12, from the ink-droplet deposition results evaluated by the image sensor.

The print determination unit 24 of the present embodiment is configured with at least a line sensor having rows of photoelectric transducing elements with a width that is greater than the ink-droplet ejection width (image recording width) of the heads 12K, 12C, 12M, and 12Y This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of the line sensor, it is possible to use an area sensor composed of photoelectric transducing elements which are arranged two-dimensionally.

The print determination unit 24 reads a test pattern image printed by the heads 12K, 12C, 12M, and 12Y for the respective colors, and the ejection of each head is determined. The ejection determination includes the presence of the ejection, measurement of the dot size, and measurement of the dot deposition position.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In the cases in which printing is performed with dye-based ink on porous paper, blocking the pores of the paper by the application of pressure prevents the ink from coming into contact with ozone and other substance that cause dye molecules to break down, and has the effects of increasing the durability of the print.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and thereby the uneven shape is transferred to the image surface.

The printed matter generated in this manner is outputted from the paper output unit 26.

The target print (i.e., the result of printing the target image) and the test print are preferably outputted separately. In the inkjet recording apparatus 10, a sorting device (not shown) is provided for switching the outputting pathways in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed directly in front of the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B. Although not shown in drawings, the paper output unit 26A for the target prints is provided with a sorter for collecting prints according to print orders.

Next, the structure of the heads 12K, 12C, 12M and 12Y is described below. The heads 12K, 12C, 12M and 12Y corresponding to the respective colors have the same structure, and a reference numeral 50 is hereinafter designated to any of the heads.

Figure 2:
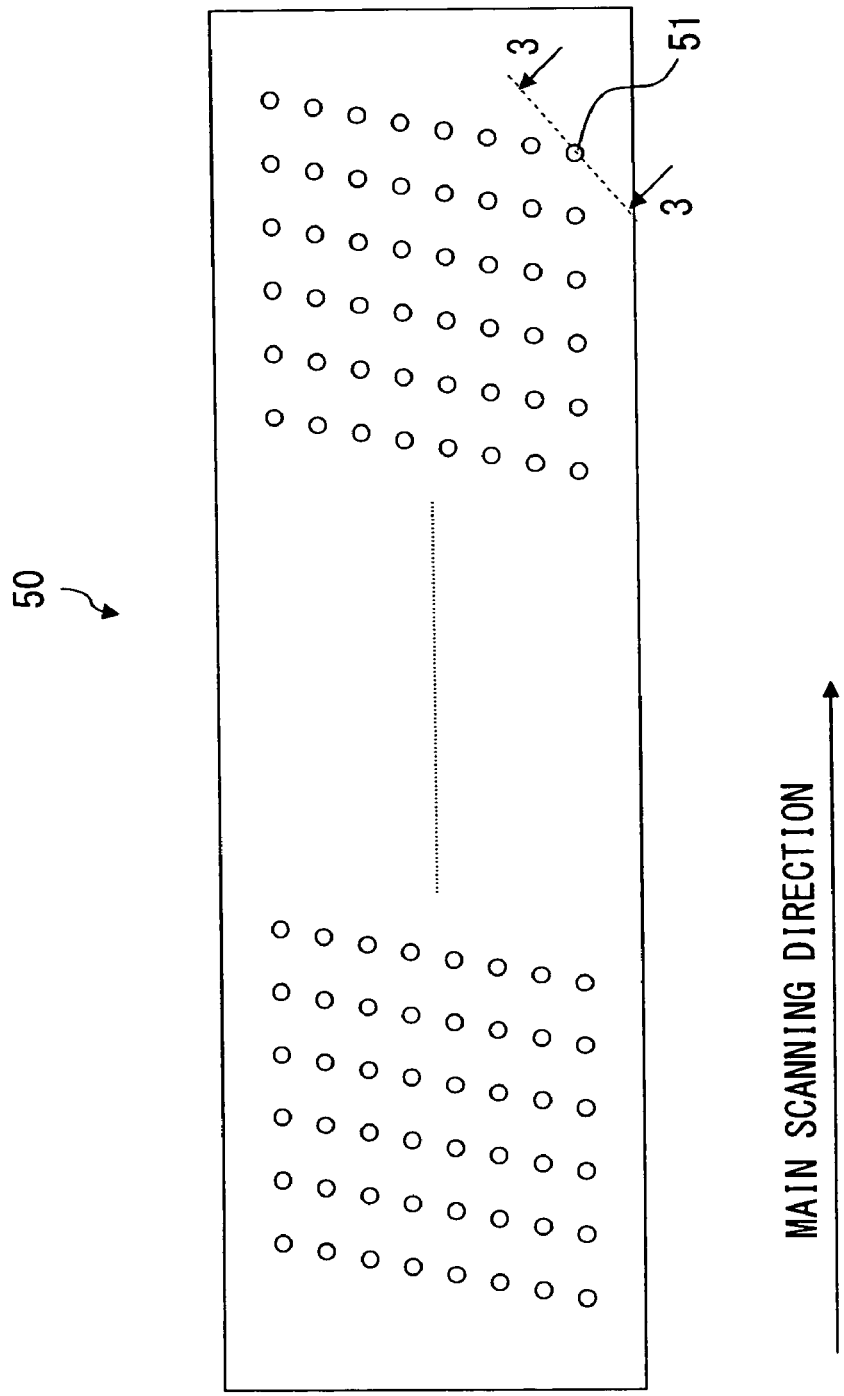
FIG. 2 is a plan diagram showing an ink ejection surface of a head.
Figure 3:
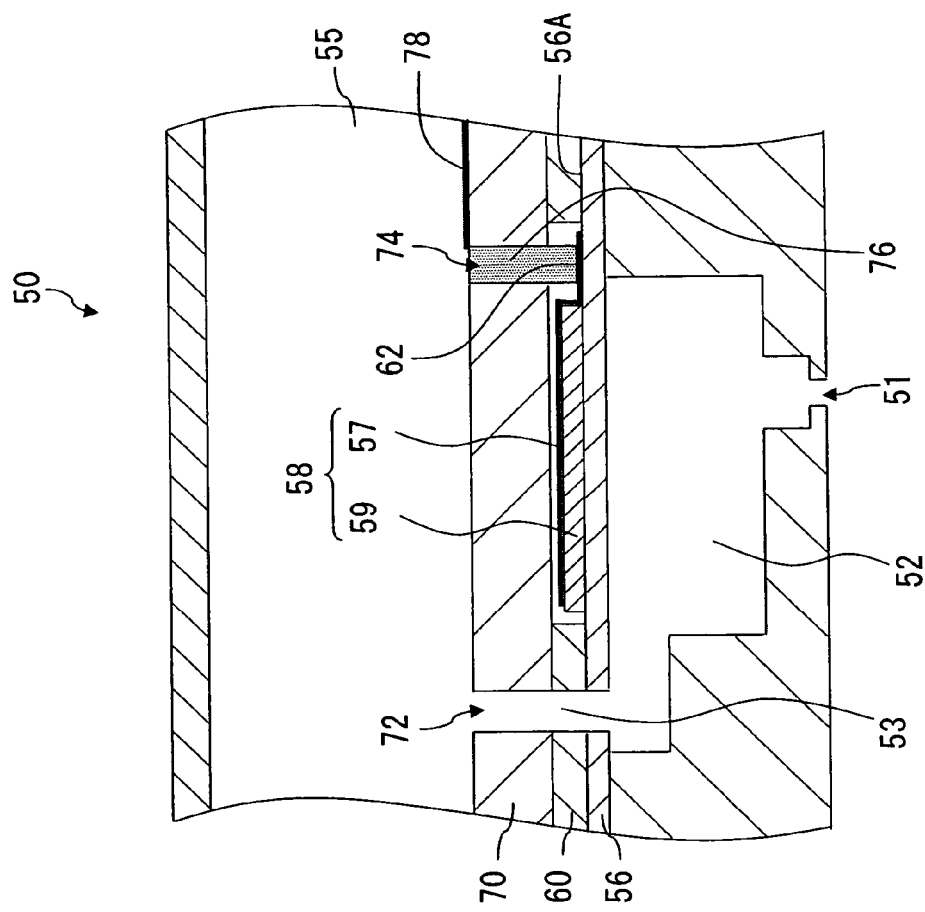
FIG. 3 is a cross-sectional diagram along line 3-3 in FIG. 2.

FIG. 2 is a plan diagram showing an ink ejection surface (nozzle surface) of the head 50; and FIG. 3 is a cross-sectional diagram along line 3-3 in FIG. 2. As shown in FIG. 2, the head 50 according to the present embodiment has a plurality of nozzles 51 arranged in a two-dimensional (matrix) configuration following a main scanning direction corresponding to the lengthwise direction of the head 50 and an oblique direction which is not perpendicular to the main scanning direction. Although not shown in FIG. 2, a composition is adopted wherein, when the nozzles 51 are projected to an alignment in one row in the main scanning direction, the (projected) nozzles 51 are arranged at a uniform nozzle pitch and spaced equally, and hence a high density can be achieved for the pitch of the dots printed onto the surface of the recording paper.

As shown in FIG. 3, pressure chambers 52 that correspond to the nozzles 51 respectively are provided inside the head 50. One wall surface of each pressure chamber 52 (the upper wall surface in FIG. 3) is constituted by a diaphragm 56. Piezoelectric elements 58 are provided on the surface 56A of the diaphragm 56 reverse to the surface on which the pressure chambers 52 are arranged, at positions corresponding to the pressure chambers 52. Furthermore, a spacer 60 and a wiring substrate 70 are stacked onto the piezoelectric element 58 side of the diaphragm 56. The space created across the wiring substrate 70 from the spacer 60 is a common flow channel 55. The common flow channel 55 is connected to the pressure chambers 52 through individual flow channels 53 passing through the wiring substrate 70, the spacers 60 and the diaphragm 56. The individual flow channels 53 are provided respectively for the pressure chambers 52. Ink supplied from the ink storing and loading unit 14 shown in FIG. 1 fills the common flow channel 55, and then this ink is distributed and supplied to the respective pressure chambers 52 via the individual flow channels 53.

Each piezoelectric element 58 on the diaphragm 56 has a structure in which an individual electrode (drive electrode) 57 is provided on the upper surface (which corresponds to a "front surface") of a piezoelectric thin film 59. In the present embodiment, the diaphragm 56 is made of a conductive member of stainless steel, or the like, and it also serves as a common electrode for the plurality of piezoelectric elements 58. Electrical connection parts (pad parts) 62 are provided on the surface 56A of the diaphragm 56 on which the piezoelectric elements 58 are arranged, in a position adjacent to the corresponding piezoelectric elements 58, and these electrical connection parts 62 are connected to the corresponding individual electrodes 57. An insulating layer (not shown) is provided between each electrical connection part 62 and the surface 56A.

A plurality of first hole parts 72 and a plurality of second hold parts 74 are provided at high density in the wiring substrate 70. In FIG. 3, one first hole part 72 and one second hole part 74 are depicted. The first hole parts 72 are non-conductive through holes which each form a portion of an individual flow channel 53, and on the other hand, the second hole parts 74 are conductive through holes which each create an electrical connection. Conductive material members 76 are filled into the second hole parts 74 respectively. One end (the lower end in FIG. 3) of each conductive material member 76 projects the spacer 60 side and makes contact with the corresponding electrical connection part 62, thereby establishing the electrical connection between the conductive material member 76 and the electrical connection part 62. Furthermore, the other end (the upper end in FIG. 3) of each conductive material member 76 is connected to a lead wire 78 disposed on the common flow channel 55 side of the wiring substrate 70. The lead wire 78 is extended to the end of the head, and is connected to a drive circuit (not shown) through an external wiring member, such as a flexible cable.

By adopting the composition described above, when a prescribed drive voltage is applied from the drive circuit to a piezoelectric element 58, the ink inside the corresponding pressure chamber 52 is pressurized through the deformation of the diaphragm 56 caused by displacement of the piezoelectric element 58, and hence an ink droplet is ejected from the corresponding nozzle 51. After the ink droplet is ejected, new ink is supplied to the pressure chamber 52 from the common flow channel 55, through the corresponding individual flow channel 53.

Next, a method of manufacturing the head 50 is described below. In the following explanation, firstly, a method of manufacturing the wiring substrate 70 in the head 50 is described in detail, whereupon a method of manufacturing the head 50 is described.

FIGS. 4A to 4H are illustrative diagrams showing a method of manufacturing the wiring substrate 70.

Figure 4A:
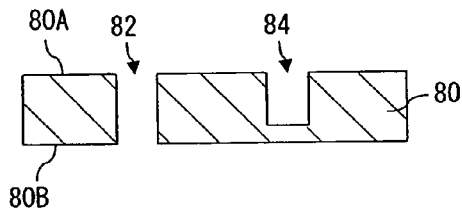
FIGS. 4A to 4H are illustrative diagrams showing a method of manufacturing a wiring substrate.

Firstly, in a hole part forming step, as shown in FIG. 4A, a substrate 80 made of an electrical insulating material which has thermal resistance and dimensional stability, such as epoxy resin, is prepared, and first hole parts (through holes) 82 and second hole parts (non-through holes) 84 are formed in the substrate 80. The first hole parts 82 penetrates the upper surface and the bottom surface (which corresponds to a "rear surface") of the substrate 80, and the second hole parts 84 have bottoms and are open on the upper surface side. The upper surface of the substrate 80 is denoted with the reference numeral 80A, and the bottom surface of the substrate 80 is denoted with the reference numeral 80B. The method of processing the hole parts 82 and 84 may be a drilling process, laser processing (for example, the through holes and the non-through holes can be formed selectively by controlling the number of pulses of an excimer laser), resin molding, sandblasting (for example, the amount of processing in the depth direction can be adjusted by changing the opening surface area in the mask), or the like. In particular, resin molding is preferable in view of the fact that a plurality of hole parts 82 and 84 can be formed at the same time. The electrical insulating material may be a sheet material (which generally has a thickness of 200 μm or less) of PET (Polyethylene Terephthalate), PEN (Polyethylene Naphtahalate), PI (Polyimide), or the like. In this case, it is possible to simultaneously form it by imprint lithography, rather than resin molding. In a case where a substrate 80 including the hole parts 82 and 84 is used from the start, the hole part forming step is not necessary.

Figure 4E:
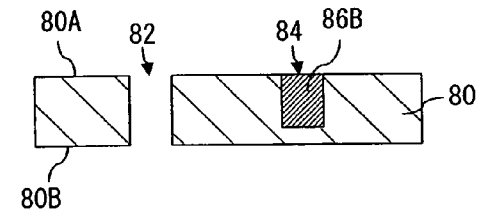
Figure 4B:
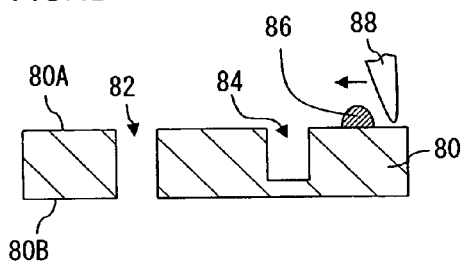

Thereupon, in a conductive material filling step, as shown in FIG. 4B, conductive material 86 in the form of a paste (conductive paste) (such as copper or silver) is filled into the hole parts 82 and 84 by carrying out screen printing with respect to the upper surface 80A of the substrate 80 (the surface of a side on which the openings of the second hole parts 84 are provided). In FIG. 4B, the reference numeral 88 denotes a simplified view of a squeegee used in the screen printing. The conductive pastes 86 can be filled into the second hole parts 84 by the screen printing in vacuum. FIG. 4C is a diagram showing a state after filling of the conductive pastes 86. The conductive pastes inside the first hole parts 82 are denoted with the reference numeral 86A and the conductive pastes inside the second hole parts 84 are denoted with the reference numeral 86B.

In order to improve filling properties of the conductive pastes 86 into the hole parts 82 and 84 in the conductive material filling step, as shown in FIG. 5, it is desirable to roughen the opening perimeter parts 90 and 92 of the hole parts 82 and 84 on the upper surface 80A of the substrate 80, and it is more desirable for this surface roughness to be greater than 50 μm (where Ra>50 μm). Consequently, a rotational force is generated in the conductive pastes 86 at the opening perimeter parts 90 and 92, and hence the conductive pastes 86 are filled readily into the hole parts 82 and 84.

Figure 4F:
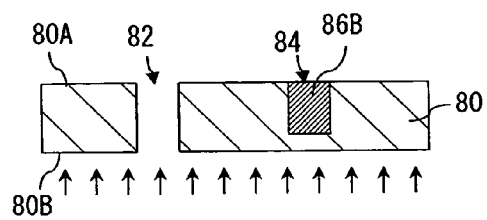
Figure 4C:
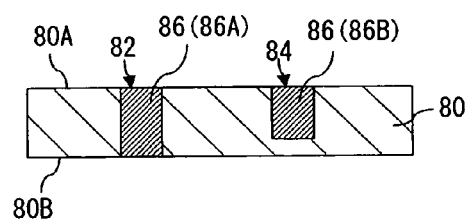
Figure 4G:
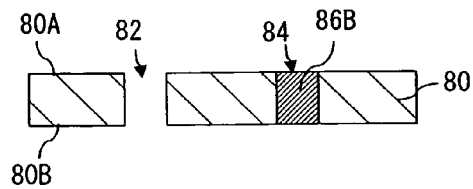
Figure 4D:
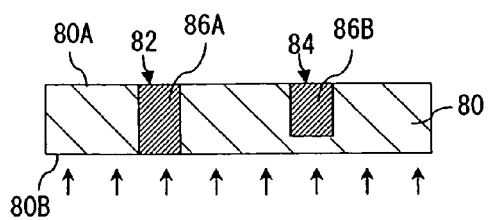

Next, in the conductive material removing step, as shown in FIG. 4D, the conductive pastes 86A inside the first hole parts (through holes) 82 are removed by using an air gun, water jet, sandblasting, dry etching, or the like, from the bottom surface 80B side of the substrate 80. FIG. 4E is a diagram showing a state after the removal of the conductive pastes 86A. In this removal step, it is necessary to set a pressure which does not affect the substrate 80 and which is sufficient to remove the conductive pastes 86A inside the first hole parts 82. Since the removal process is carried out with respect to the first hole parts 82 only, then it is possible to remove the conductive pastes 86A reliably even in cases where the hole parts 82 and 84 are arranged at high density on the substrate 80, and selection of the through holes and non-through holes can be performed very easily and hence the reliability is improved.

For the conductive pastes 86, the characteristics such as electrical resistance may be selected in accordance with the intended application, and the amount of solvent in the pastes may be selected in accordance with the adopted removal method. A "solvent-less" paste which has virtually no change in viscosity is suitable for the vacuum screen printing.

Moreover, as shown in FIG. 6, it is desirable to make the surface roughness on the internal wall surfaces of the second hole parts (non-through holes) 84 larger than the surface roughness on the internal wall surfaces of the first hole parts (through holes) 82. In a conductive material removal step, if the internal wall surfaces of the first hole parts 82 has a large surface roughness, then there is a possibility that the removability of the conductive pastes 86A is reduced, due to the anchor effect. On the other hand, if the internal wall surfaces of the second hole parts 84 has a small surface roughness, then there is a possibility that the adhesion of the conductive pastes 86B is reduced. Consequently, it is desirable that the surface roughness of the internal wall surfaces of the hole parts 82 and 84 should have the relationship described above. For example, the surface roughness of the internal wall surfaces of the first hole parts 82 may be taken to be 1 μm or less (Ra≦1 μm), and the surface roughness of the internal wall surfaces of the second hole parts 84 may be taken to be greater than 2 μm (Ra>2 μm).

Next, in a hole part penetration step, as shown in FIG. 4F, a removal process is carried out from the bottom surface 80B side of the substrate 80, and the second hole parts (non-through holes) 84 are opened on the bottom surface 80B side. In other words, the conductive pastes 86B inside the second hole parts (non-through holes) 84 are exposed on the bottom surface 80B side. FIG. 4G is a diagram showing a state after the hole part penetration step.

In the hole part penetration step, mechanical process such as grinding or blasting, dry etching, wet etching, or another method can be used. It is also possible to carry out the removal process on the whole of the bottom surface 80B of the substrate 80, and it is also possible to carry out the removal process on only the portions corresponding to the second hole parts 84. When a blasting process is used in this step, the higher removal performance should be carried out, in comparison with that in the blasting process in the conductive material removal process described above. Moreover, it is also possible to add a heating process (or a drying process) before the hole part penetration step, in such a manner that the removal process is carried out after the conductive pastes 86B have been set to a semi-cured state.

Figure 4H:
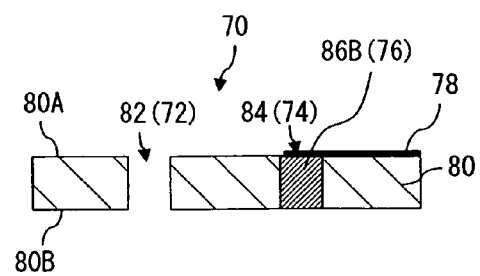

Finally, in a wiring step, as shown in FIG. 4H, lead wires 78 which connect to the conductive pastes 86B inside the second hole parts 84 are provided on the upper surface 80A of the substrate 80. There is of course also a mode in which the lead wires 78 are installed on the bottom surface 80B in accordance with the application of the wiring substrate 70, and a mode in which they are installed on either surface (80A and 80B). Furthermore, in the case of a mode where no lead wires 78 are installed at all, the wiring step is not necessary. In this way, the wiring substrate 70 is obtained.

Figure 7A:
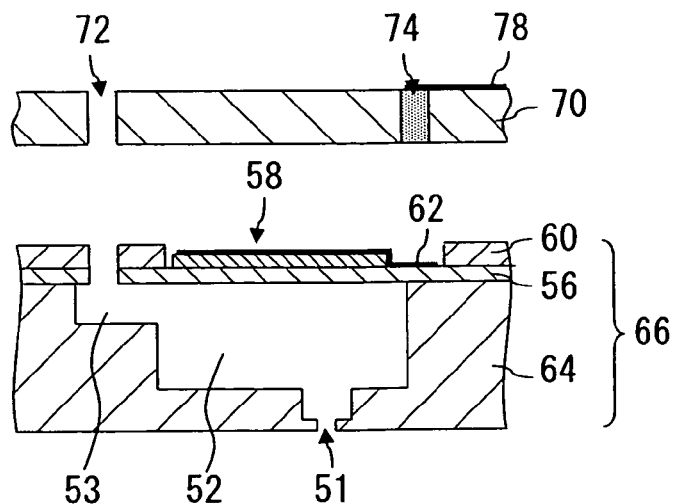
FIGS. 7A to 7C are illustrative diagrams showing a method of manufacturing a head.
Figure 7B:
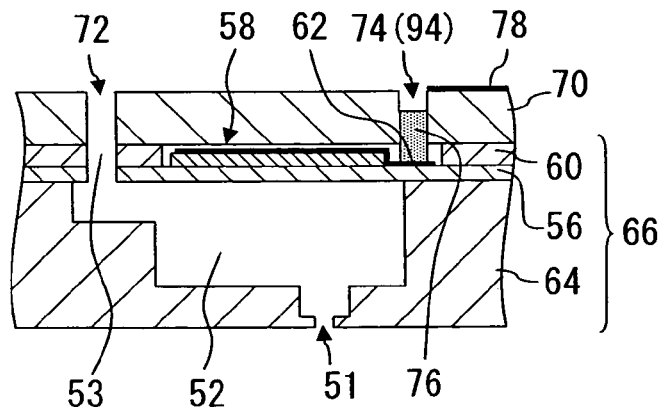
Figure 7C:
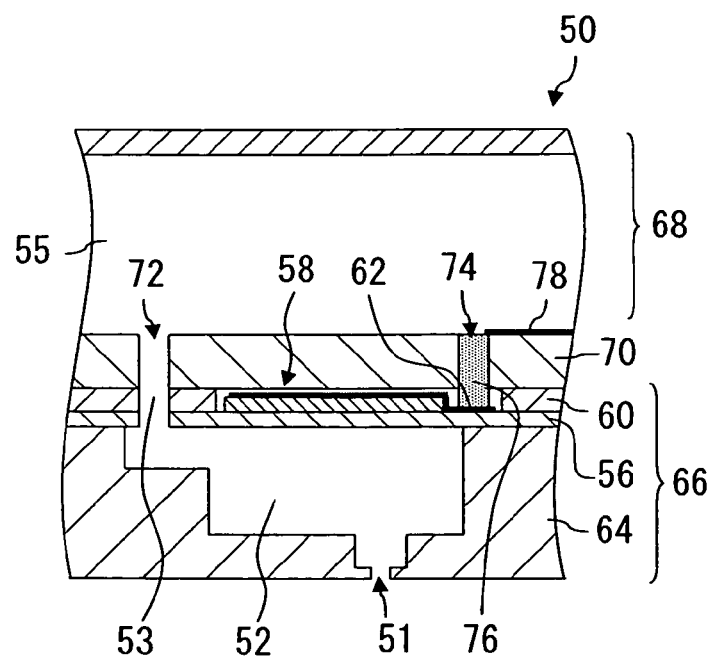

FIGS. 7A to 7C are illustrative diagrams showing a method of manufacturing the head 50.

Firstly, in a wiring substrate bonding step, as shown in FIG. 7A, the wiring substrate 70 is bonded to a laminated body 66 constituted by bonding together a flow channel substrate 64, a diaphragm 56, and a spacer 60. The flow channel substrate 64 comprises nozzles 51, pressure chambers 52, and the like. On the diaphragm 56, the piezoelectric elements 58 are installed. The flow channel substrate 64 may be constituted by a plurality of thin plate members, or it may be constituted as a single substrate by resin molding, or the like. The laminated body 66 can be manufactured by means of a commonly known method, and therefore description thereof is omitted here.

When the wiring substrate 70 is bonded to the laminated body 66, the pressure of the laminated body 66 side is set to a negative pressure. After the bonding is performed, it is returned to a normal pressure state. As shown in FIG. 7B, the conductive material member 76 (the conductive paste 86B) inside each second hole part 74 thus projects toward the spacer 60, and is electrically connected with the corresponding electrical connection part 62 on the diaphragm 56. Furthermore, by refilling conductive paste or reflowing solder into the recess parts 94 inside the second hole parts 74 which are formed by the projection of the conductive material members 76, the lead wires 78 are electrically connected with the conductive material members 76 inside the second hole parts 74.

In FIG. 7A, it is possible to dispose solder balls (not shown) on top of the electrical wiring parts 62, and to then bond the wiring substrate 70 to the laminated body 66. In this case, it is not necessary to create a negative pressure of the laminated body 66 side. According to this method, in contrast to the above-described method which does not use the solder balls, the recess parts 94 (see FIG. 7B) are not formed inside the second hole parts 74 and refilling of conductive paste or reflow of solder is not required. In other words, the number of processing steps is reduced and costs can be lowered.

Thereupon, in a common flow channel forming substrate bonding step, as shown in FIG. 7C, a common flow channel forming substrate 68 is arranged on and bonded to the wiring substrate 70 which is bonded to the laminated body 66. Before the bonding of the common flow channel forming substrate 68, for example, insulating and protective films (not shown) made of resin, or the like, are formed on the portions (including the upper surface of the wiring substrate 70 which forms the bottom surface of the common flow channel 55) which are to be exposed to the ink inside the common flow channel 55. In this way, the head 50 is obtained.

According to the first embodiment, after filling the conductive pastes (86A, 86B) into the first hole parts (through holes)

82 and the second hole parts (non-through holes) 84 formed in the substrate 80, a process for removing the conductive pastes 86A inside the first hole parts 82 is carried out from the bottom surface 80B side of the substrate 80, and furthermore, the second hole parts 84 are opened up on the bottom surface 80B side to form through holes by carrying out removal processing from the bottom surface 80B side of the substrate 80. By following these steps, since through holes and non-through holes can be formed readily, then even in the cases where the distance between adjacent holes is very short (in other words, the hole density is high) and the number of holes is extremely high, it is possible to form the conductive through holes 74 and the non-conductive through holes 72 in a reliable fashion. In other words, it is possible to manufacture, inexpensively, the wiring substrate 70 having the highly reliable conductive through holes 74 and non-conductive through holes 72 formed at high density.

Second Embodiment

Next, a second embodiment of the present invention is described below. Parts of the second embodiment that are common to the first embodiment described above are not described, and the explanation focuses on the characteristic features of the present embodiment.

FIGS. 8A to 8H are illustrative diagrams showing a method of manufacturing a wiring substrate 70 according to the second embodiment. In FIGS. 8A to 8H, portions which are common to those in FIGS. 4A to 4H are denoted with the same numerals.

Figure 8A:
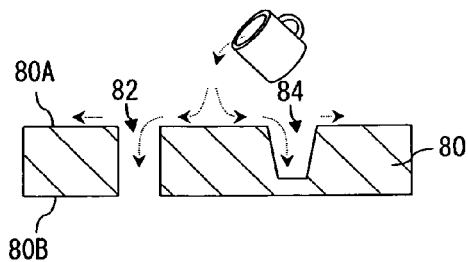
FIGS. 8A to 8H are illustrative diagrams showing a method of manufacturing a wiring substrate according to a second embodiment.

Firstly, in a hole part forming step, similarly to the first embodiment, first hole parts (through holes) 82 and second hole parts (non-through holes) 84 are formed in the substrate 80 (see FIG. 8A). In the present embodiment, the second hole parts 84 are formed so as to have a tapered shape in which the diameter increases gradually toward the open side.

Figure 8E:
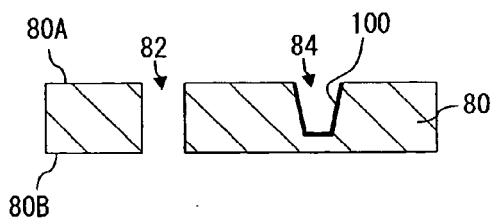
Figure 8B:
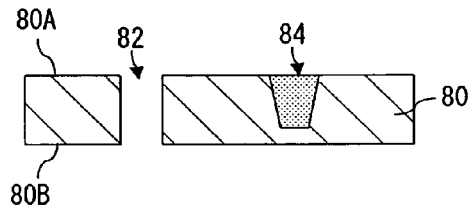

Thereupon, in a liquid filling step, as shown in FIG. 8A, a liquid containing a prescribed solvent (for example, alcohol) and a catalyst (a metal powder having a particle diameter of several μm or less, such as gold or palladium) serving as a plating start point, is inpoured into the second hole parts 84 from the upper surface 80A side of the substrate 80. FIG. 8B is a diagram showing a state after the liquid filling step. As shown in FIG. 8B, the liquid used in the liquid filling step does not accumulate in the first hole parts (through holes) 82 and only accumulates in the second hole parts (non-through holes) 84.

Figure 8F:
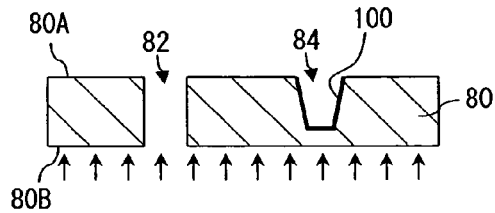
Figure 8C:
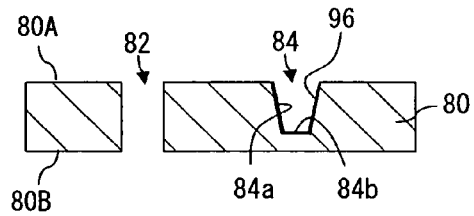

Thereupon, when the solvent contained in the liquid inside the second hole parts 84 is removed in a solvent removal step, the catalyst (metal powder) 96 adheres to the inner wall surfaces of the second hole parts 84 as shown in FIG. 8C. The removal of the solvent is carried out by using evaporation, for example. If the density of the catalyst 96 adhering to the inner walls of the second hole parts 84 is low, then it is desirable to repeat the liquid filling step and the solvent removal step a plurality of times.

Furthermore, similarly to the first embodiment, it is also desirable to make the surface roughness of the inner wall surfaces of the second hole parts 84 greater than the surface roughness of the inner wall surfaces of the first hole parts 82. Thereby, it is possible to increase the separability of the catalyst 96 with respect to the inner wall surfaces of the first hole parts 82, and to increase the adhesion of the catalyst 96 with respect to the inner wall surfaces of the second hole parts 84. Moreover, it is also desirable to make a surface roughness of portions of the side wall faces 84a which are nearby the openings of the second hole parts 84 greater than a surface roughness of portions of the side wall faces 84a which are nearby the bottom surfaces 84b of the second hole parts 84. In the side wall surfaces 84a of the second hole parts 84, a larger amount of catalyst 96 tends to adhere to the portions which are in the vicinity of the bottom surfaces 84b, on the opposite side from the openings, than portions which are in the vicinity of the openings. Consequently, by controlling the surface roughness of the side wall surfaces 84a of the second hole parts 84 as described above, it is possible to make the catalyst 96 adhere uniformly to the side wall surfaces 84a of the second hole parts 84.

Figure 8G:
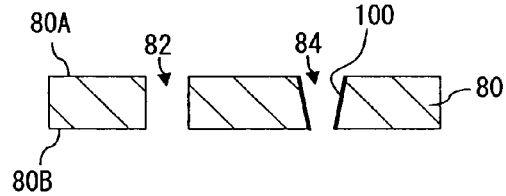
Figure 8D:
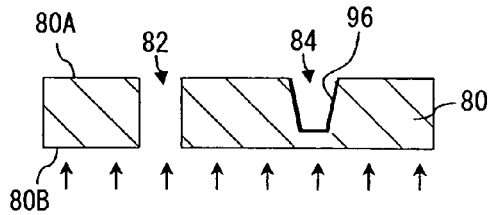

Furthermore, if the catalyst adheres to the inner wall surfaces of the first hole parts 82 because of the liquid introduced in the liquid filling step, then, as shown in FIG. 8D, it is desirable to carry out a removal process from the bottom surface 80B side of the substrate 80 as a solvent removal step.

Furthermore, it is also possible to carry out a hydrophobic treatment on the inner wall surfaces of the first hole parts 82 after the hole part forming step. This hydrophobic treatment makes it possible to prevent catalyst from adhering to the inner wall surfaces of the first hole parts 82. The hydrophobic treatment method may involve immersing the substrate 80 in a hydrophobic solution from the bottom surface 80B side, or sputtering DLC (Diamond-Like Carbon) from the bottom surface 80B side, In the latter case, it is more desirable to form each first hole part 82 into a tapered shape which expands in diameter from the upper surface 80A side toward the bottom surface 80B side as shown in FIG. 9, since this makes the hydrophobic films 98 formed more effectively than in a case where the first hole parts 82 have a straight shape (see FIGS. 8A to 8H).

Thereupon, in a plating step, electroless plating is carried out by using the catalyst (metal powder) 96 adhering to the inner wall surfaces of the second hole parts 84 as a seed. Thereby, as shown in FIG. 8E, conductive layers 100 are formed on the inner wall surfaces of the second hole parts 84 respectively.

Next, in a hole part penetration step, as shown in FIG. 8F, a removal process is carried out from the bottom surface 80B side of the substrate 80, and the second hole parts 84 are opened on the bottom surface 80B side. FIG. 8G is a diagram showing a state after the hole part penetration step. The method used for the removal process is the same as that in the first embodiment.

Figure 8H:
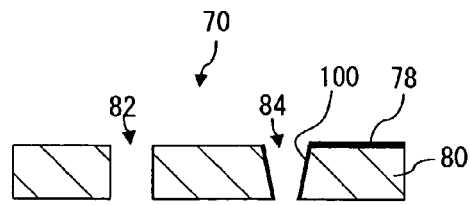
Figure 9:
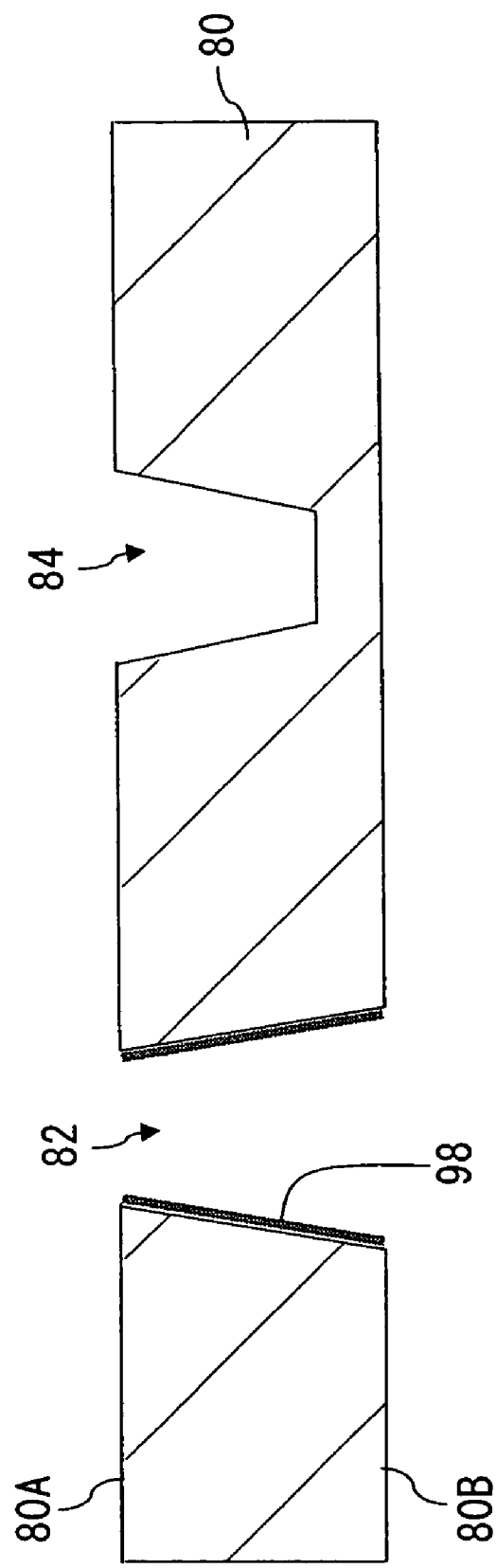
FIG. 9 is an illustrative diagram showing an embodiment of a hydrophobic film formed on the inner wall surface of a first hole part.

Finally, in a wiring step, as shown in FIG. 8H, lead wires 78 which connect to the conductive layers 100 on the internal surface walls of the second hole parts 84 respectively are provided on the upper surface 80A (and/or the bottom surface 80B) of the substrate 80. In this way, the wiring substrate 70 is obtained.

Figure 10A:
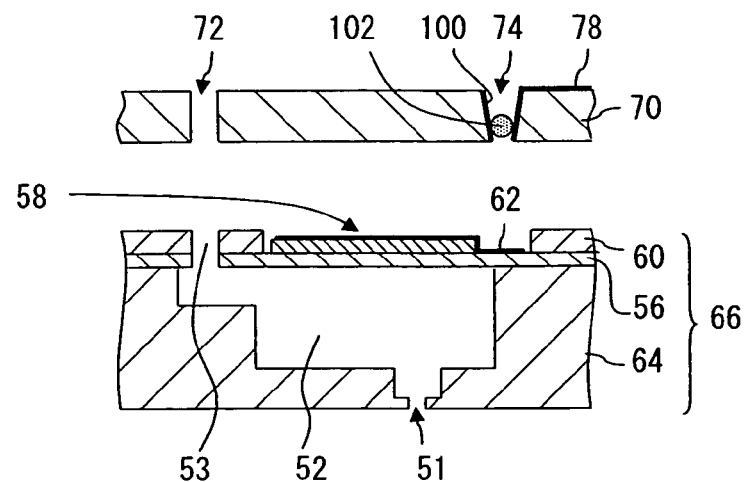
FIGS. 10A to 10C are illustrative diagrams showing a method of manufacturing a head according to a second embodiment.
Figure 10B:
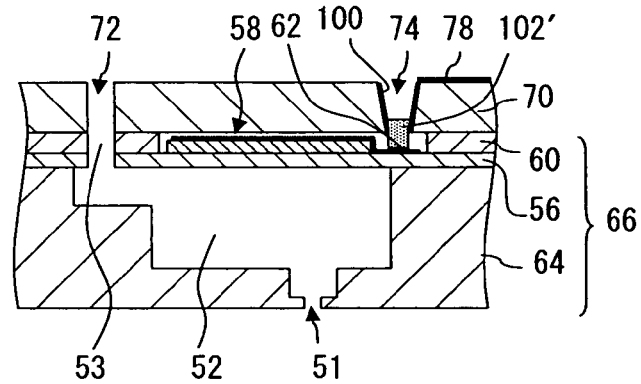
Figure 10C:
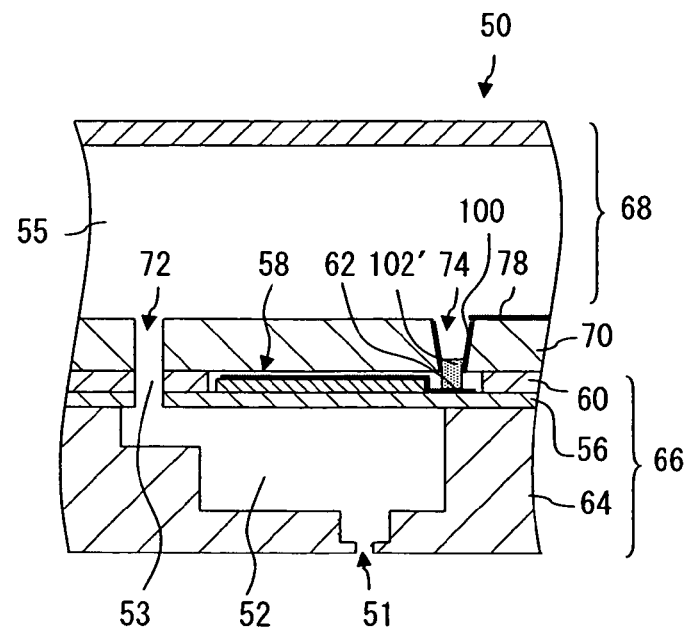

FIGS. 10A to 10C are illustrative diagrams showing a method of manufacturing the head 50 according to the second embodiment. In FIGS. 10A to 10C, portions that are common to those in FIGS. 7A to 7H are denoted with the same numerals.

Firstly, in a wiring substrate bonding step, as shown in FIG. 10A, the wiring substrate 70 is bonded to the laminated body 66 which includes the flow channel substrate 64, the diaphragm 56 (including piezoelectric elements 58), and the spacer 60. In this case, a solder ball 102 is inserted into each of the second hole parts 74 of the wiring substrate 70.

Figure 11:
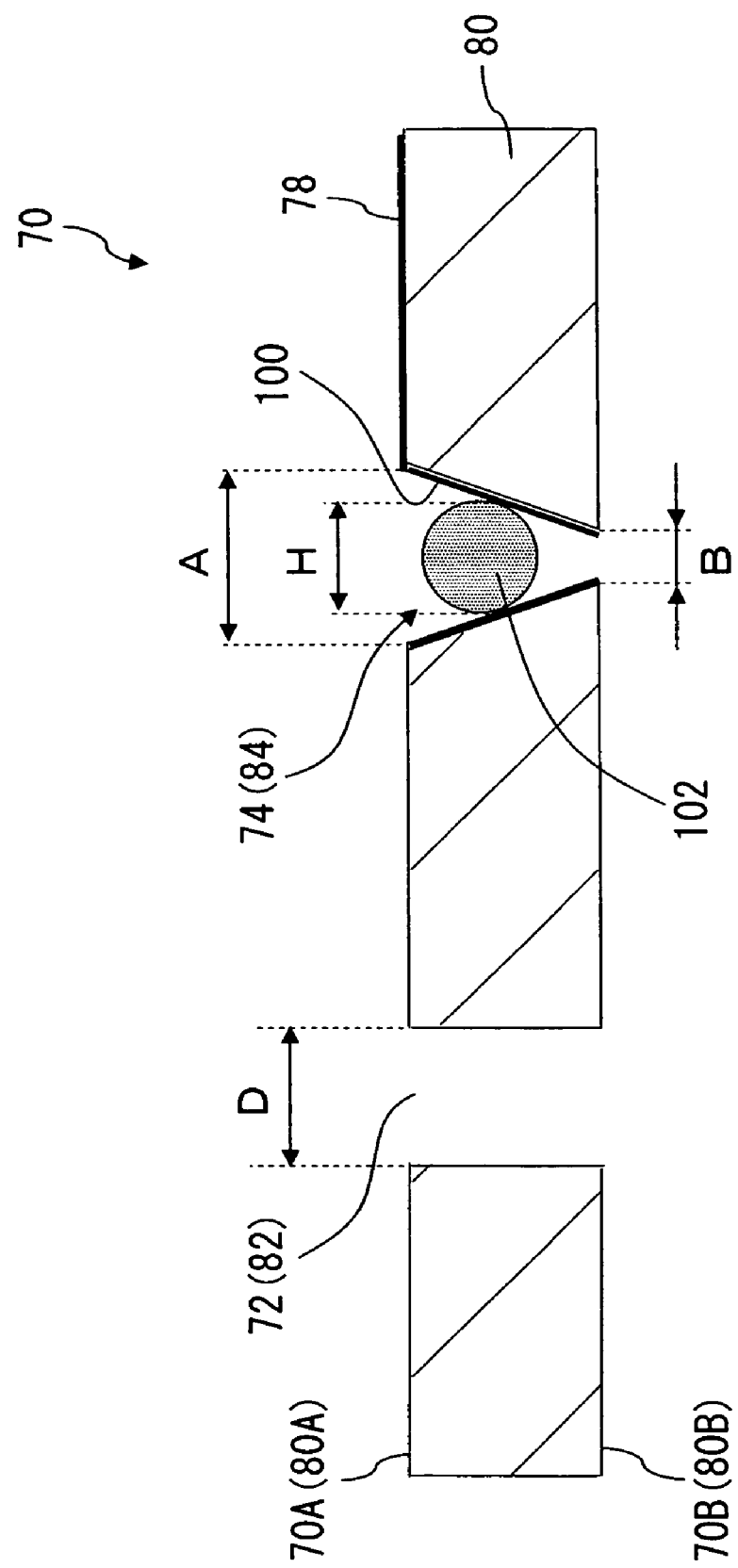
FIG. 11 is an illustrative diagram showing the relationship between a solder ball and a hole part.

FIG. 11 is an illustrative diagram showing the relationship among a solder ball 102, a hole part 72 and a hole part 74. In FIG. 11, taking the diameter of the solder balls to be H, the internal diameter of the second hole parts 74 (84) on the upper surface 70A side of the wiring substrate 70 (i.e., the upper surface 80A side of the substrate 80) to be A, the internal diameter of the bottom surface 70B side of the wiring substrate 70 (the bottom surface 80B side of the substrate 80) to be B, and the internal diameter of the first hole parts 72 (82) to be D, it is desirable that the following relationships be established: B<H<A, and H<D. According to these relationships, it is possible to readily introduce the solder balls 102 only into the second hole parts 74 which are formed with the conductive layers 100, of the hole parts 72 and 74 in the wiring substrate 70.

Next, the wiring substrate 70 is subjected to heating in a heating step after the bonding. Thereby, as shown in FIG. 10B, the solder balls 102 inside the second hole parts 74 are subjected to reflow and a portion of each solder ball 102 makes contact with the electrical connection parts 62. In this way, an electrically connected state between the conductive layers 100 and the electrical connection sections 62 is created. In this case, as shown in FIG. 12, it is desirable to provide pin-shaped members 104 on the electrical connection parts 62 respectively, in such a manner that the pin-shaped members 104 have a length such that the tips thereof enter into the second hole parts 74. According to this case, it is possible to attain the reliable reflow of the solder balls 102.

Next, similarly to the first embodiment, insulating and protective films (not shown) are formed on the portions which are to be exposed to the ink inside the common flow channel 55 (for example, a surface of the wiring substrate 70), whereupon, in a common flow channel forming substrate bonding step, the common flow channel forming substrate 68 is bonded onto the wiring substrate 70, as shown in FIG. 10C. In this way, the head 50 according to the second embodiment is obtained.

According to the second embodiment, similarly to the first embodiment, it is possible to manufacture, inexpensively, the wiring substrate 70 having the highly reliable conductive through holes 74 and non-conductive through holes 72 which are formed at high density.

Third Embodiment

Next, a third embodiment of the present invention is described below. The parts of the third embodiment which are common to the first embodiment described above are not described, and the explanation focuses on the characteristic features of the present embodiment.

FIGS. 13A to 13D are illustrative diagrams showing a method of manufacturing a wiring substrate 70 according to the third embodiment. In FIGS. 13A to 13D, portions which are common to those in FIGS. 4A to 4H are denoted with the same numerals.

Figure 13A:
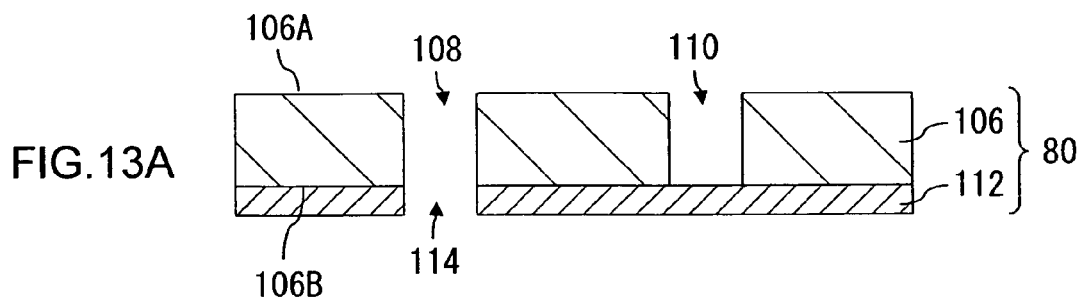
FIGS. 13A to 13D are illustrative diagrams showing a method of manufacturing a wiring substrate according to a third embodiment.

Firstly, in a hole part forming step, as shown in FIG. 13A, first hole parts 108 and second hole parts 110 are both formed so as to pass through a first substrate 106, and furthermore, third hole parts 114 of the same diameter as the first hole parts 82 are formed at positions corresponding to the first hole parts 82 so as to pass through a second substrate 112. The third hole parts 114 may have a diameter greater than that of the first hole parts 108. The second substrate 112 is bonded to the bottom surface 106B side of the first substrate 106, while position alignment is implemented in such a manner that the first hole parts 108 and the third hole parts 114 are mutually overlapping. The first and second substrates 106 and 112 bonded together in this state are comparable to the substrate 80 of the first embodiment described above. In the following description, the term "substrate 80" is used for indicating the jointed substrate of the first and second substrates 106 and 112. The substrate 80 has through holes constituted by the first hole parts 108 and the third hole parts 114, and non-through holes having a bottom which are open at the upper surface 106A side of the first substrate 106.

Figure 13B:
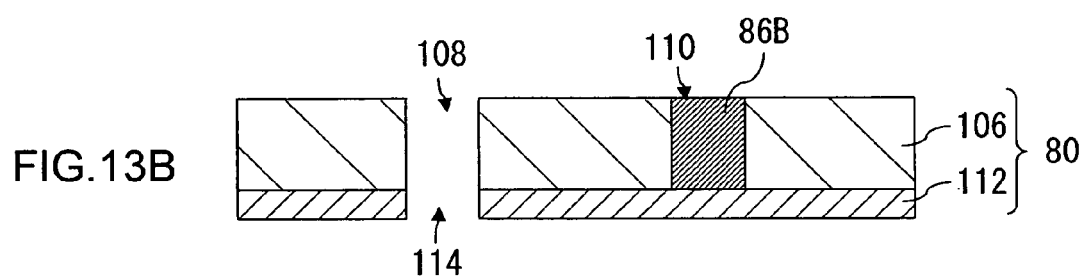

Next, the substrate 80 is subjected to the conductive material filling step (see FIGS. 4B and 4C), and the conductive material removal step (see FIGS. 4D and 4E), similarly to the first embodiment. Consequently, as shown in FIG. 13B, a state is achieved in which the conductive pastes 86B are filled only into the second hole parts 110 whose bottom faces are constituted by the second substrate 112.

Figure 13C:
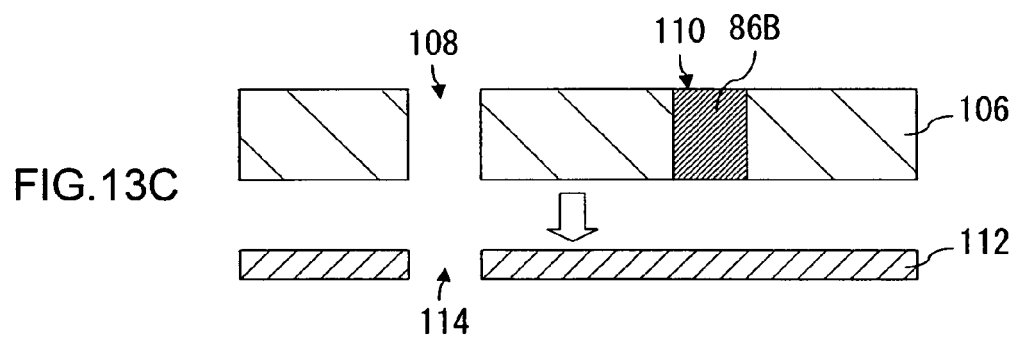
Figure 13D:
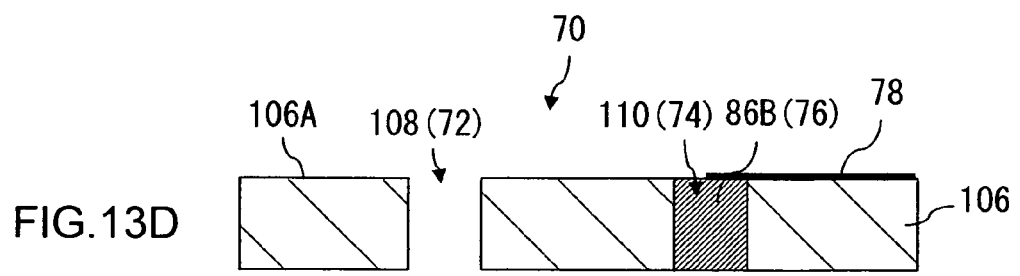

Next, in a mask separating step, the second substrate 112 is separated from the first substrate 106, as shown in FIG. 13C. After the separation, similarly to the wiring step of the first embodiment (see FIG. 4H), lead wires 78 are installed on the upper surface 106A of the first substrate 106, as shown in FIG. 13D. In this way, the wiring substrate 70 according to the third embodiment is obtained. The method of manufacturing the head 50 including the wiring substrate 70 is similar to that in the first embodiment described above.

According to the third method of manufacture, the mask removal step is carried out instead of the hole part penetration step of the first embodiment, and therefore the process can be simplified and costs can be reduced.

Methods of manufacturing a liquid ejection head, liquid ejection heads and image forming apparatuses according to the present invention are described above in detail, but the present invention is not limited to the aforementioned embodiments, and it is of course possible for improvements or modifications of various kinds to be implemented, within a range which does not deviate from the essence of the present invention.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a wiring substrate, including the steps of:
    filling conductive material into a through hole and a non-through hole of a substrate;
    removing the conductive material filled into the through hole; and
    removing at least a portion of a rear side of the substrate which is opposite to a front side of the substrate at which the non-through hole is open, in such a manner that the non-through hole is open at the rear side of the substrate.

2. A method of manufacturing a wiring substrate, including the steps of:
    filling liquid containing at least a plating catalyst and solvent, into a through hole and a non-through hole of a substrate;
    carrying out plating by using the plating catalyst as a seed; and
    removing at least a portion of a rear side of the substrate which is opposite to a front side of the substrate at which the non-through hole is open, in such a manner that the non-through hole is open at the rear side of the substrate.

3. The method of manufacturing a wiring substrate as defined in claim 1, wherein a surface roughness of an internal wall surface of the non-through hole is greater than a surface roughness of an internal wall surface of the through hole.

4. The method of manufacturing a wiring substrate as defined in claim 2, wherein a surface roughness of an internal wall surface of the non-through hole is greater than a surface roughness of an internal wall surface of the through hole.

5. A liquid ejection head comprising a wiring substrate manufactured by the method of manufacturing a wiring substrate as defined in claim 1.

6. A liquid ejection head comprising a wiring substrate manufactured by the method of manufacturing a wiring substrate as defined in claim 2.

7. An image forming apparatus comprising the liquid ejection head as defined in claim 5.

8. An image forming apparatus comprising the liquid ejection head as defined in claim 6.

* * * * *